United States Patent [19]

Espe et al.

[11] 4,357,547

[45] Nov. 2, 1982

[54] EFL TOGGLE FLIP-FLOP

[75] Inventors: Roy H. Espe, Scottsdale; W. Eric Main, Mesa, both of Ariz.

[73] Assignee: Motorola, Inc., Schaumburg, Ill.

[21] Appl. No.: 237,322

[22] Filed: Feb. 23, 1981

[51] Int. Cl.³ .............................................. H03K 3/289
[52] U.S. Cl. .................................. 307/272 A; 307/289; 307/455
[58] Field of Search .............. 307/272 A, 299 A, 455, 307/467, 289, 291; 365/174, 179, 188, 205, 154, 155

[56] References Cited

U.S. PATENT DOCUMENTS 3,728,560  4/1973  Treadway ........................ 307/272 A
4,145,623  3/1979  Doucette ............................ 307/467
4,309,625  1/1982  Takahashi ...................... 307/272 A Primary Examiner—John Zazworsky
Attorney, Agent, or Firm—Vincent B. Ingrassia

[57] ABSTRACT

A toggle flip-flop of the type which is controlled by a clock signal capable of assuming high and low states includes a master circuit portion and a slave circuit portion. The master circuit portion includes a first output stage which is latched when the clock signal is high while the slave circuit portion has an output stage which is latched when the clock signal is low. A driving voltage signal is produced in the slave circuit portion for driving the second output stage. Means are provided for inverting the driving voltage signal and for using the inverted version to drive the first output stage.

8 Claims, 3 Drawing Figures

EFL TOGGLE FLIP-FLOP

BACKGROUND OF THE INVENTION

1. Field of the Invention

This invention relates generally to toggle flip-flops and, more particularly, to an improved emitter function logic (EFL) toggle flip-flop which requires fewer components and isolation tubs, and as a result, is faster, has a high maximum frequency capability, and occupies less space.

2. Description of the Prior Art

Emitter function logic (EFL) is a relatively new family of logic circuits based on a non-inverting gate structure and designed for large scale integration. It combines the advantages of multi-emitter structures with the performance of emitter coupled logic (ECL). A detailed description of emitter function logic may be found in an article by Z. E. Skokan entitled "Emitter Function Logic—Logic Family for LSI" which appeared in the IEEE Journal of Solid State Circuits, October 1973, page 356.

A known EFL master-slave delay type flip-flop includes first and second biased transistors in both the master and slave portions. The circuit includes a D input and generates only a $\overline{Q}$ output. In order to provide a Q output the first bias transistors in both the master and slave portions, which are dual emitter devices, are split into separate devices and an additional load resistor is added. This requires an additional isolation tub.

Once the $\overline{Q}$ output is made available, the master-slave delay type flip-flop may be converted to toggle flip-flop by simply coupling the $\overline{Q}$ output into the D input. Once this is accomplished, the toggle flip-flop will act as a frequency divider and will produce a signal having a frequency which is one-half that of the applied clock signal.

SUMMARY OF THE INVENTION

It is an object of the present invention to provide an improved EFL toggle flip-flop.

It is a further object of the invention to provide an EFL toggle flip-flop which requires fewer components and occupies less space.

It is still a further object of the present invention to provide an EFL toggle flip-flop which does not require any additional isolation tubs or resistors.

According to a first aspect of the invention there is provided a toggle flip-flop of the type controlled by a clock signal capable of assuming first and second states, said flip-flop comprising a master circuit portion which includes first output transistor means having a collector terminal coupled to a source of supply voltage and having first and second emitter terminals and a base terminal, and first means coupled to said first output transistor means for latching said first output transistor means when said clock signal is in said first state; a slave circuit portion having an input coupled to said second emitter of said first output transistor means for producing a Q output of said flip-flop, said slave circuit portion including second output transistor means having a collector terminal coupled to said source of supply voltage, a first emitter terminal for producing said Q output and having a second emitter terminal and a base terminal, second means coupled to the base terminal of said second output transistor means for producing a driving voltage on said base terminal, and third means coupled to said second output transistor means for latching said second output transistor means when said clock signal is in said second state; and fourth means coupled to said second means and to the base terminal of said first output transistor means for inverting said driving voltage and applying an inverted driving voltage to the base of said first output transistor means.

The above and other objects, features and advantages of the present invention will be more clearly understood from the following detailed description taken in conjunction with the accompanying drawings, in which:

DESCRIPTION OF THE PREFERRED EMBODIMENT

Figure 1:
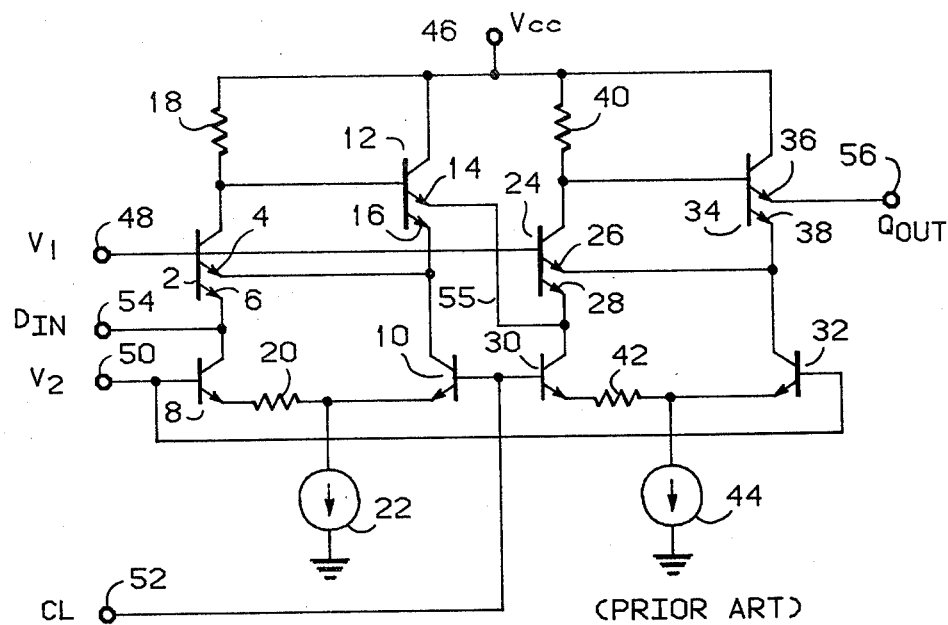
FIG. 1 is a schematic diagram of a prior art EFL master-slave delay type flip-flop having only a Q output.

FIG. 1 is a schematic diagram of an EFL master-slave delay type flip-flop according to the prior art. The master portion of the circuit includes a first biased transistor 2 having emitters 4 and 6, a second biased transistor 8, transistor 10, transistor 12 having emitters 14 and 16, load resistor 18, offset resistor 20 and current sink 22. The slave portion of the circuit comprises a first biased transistor 24 having emitters 26 and 28, a second biased transistor 32, transistor 30, transistor 34 having emitters 36 and 38, load resistor 40, offset resistor 42 and current sink 44. Resistor 18 is coupled at its one terminal to the base of transistor 12 and to the collector of transistor 2 and at its other terminal to terminal 46 which is coupled to a source of supply voltage ($V_{CC}$). The collector of transistor 12 is likewise coupled to terminal 46, and its emitter 16 is coupled to the collector of transistor 10 and to the emitter 4 of transistor 2. Emitter 6 of transistor 2 is coupled to the collector of transistor 8 which in turn has an emitter coupled to one side of offset resistor 20. The other side of resistor 20 is coupled to current sink 22 and to the emitter of transistor 10.

One end of resistor 40 is coupled to terminal 46 while its other end is coupled to the base of transistor 34 and to the collector of transistor 24. Emitter 38 of transistor 34 is coupled to the collector of transistor 32 and to emitter 26 of transistor 24. Emitter 28 of transistor 24 is coupled to the collector of transistor 30 which in turn has an emitter coupled to one end of offset resistor 42. The other end of offset resistor 42 is coupled to the emitter of transistor 32 and to current sink 44. If desired for higher speed operation, additional emitter follower transistors may be placed between the collector of transistor 2 and the base of transistor 12 and between the collector of transistor 24 and the base of transistor 34.

A first bias voltage $V_1$ is applied to terminal 48 which is coupled to the bases of bias transistors 2 and 24. A second bias voltage $V_2$ applied to terminal 50 is coupled to the base electrodes of bias transistors 8 and 32. Bias voltage $V_1$ is set to be approximately equal to $V_{CC}$ minus ½ the maximum voltage drop across load resistor 18. Bias voltage $V_2$ is then set to be approximately at the mid-point of the clock signal which can be as close as one $V_{BE}$ voltage drop below $V_1$. The clock signal or pulse stream is applied from terminal 52 to the base terminals of transistors 10 and 30. An input signal ($D_{IN}$)

at terminal 54 is applied to the collector of transistor 8 and to emitter 6 of transistor 2 while the Q output of the circuit appears at terminal 56 which is coupled to emitter 36 of transistor 34.

Before proceeding with an explanation of the operation of the circuit shown in FIG. 1, two things should be noted. First, many current sources would be suitable for use as current sinks 22 and 44. That is, current sinks 22 and 24 may be of the transistor type or may merely be resistors. Second, it will become apparent that when the clock pulse is low, the master portion of the circuit acts as a unity gain amplifier while the slave portion of the circuit acts as a latch. When the clock is high, the master portion acts as a latch while the slave portion acts as a unity gain amplifier. To prevent an undesired race condition between the master and slave portions of the circuit, offsets are built into the circuit as is well-known in the prior art. This may be accomplished in several ways. First, offset may be provided by supplying different reference voltages to the bias transistors 8 and 32 in the master and slave portions of the circuit. Second, the size of the transistors in the lower differential pairs in both the master and slave portions may be properly ratioed to produce the required offset. Finally, the required offset can be achieved through the use of emitter resistors such as is shown at 20 and 42 in FIG. 1.

It should be clear that although dual emitter structures occupy less space and exhibit less parasitic capacitance, each of the dual-emitter transistors shown in the drawings could be replaced by separate single emitter transistors with base and collector terminals coupled together. It should also be noted that the clock (CL) signal and the bias (V2) signal could be interchanged. If so interchanged, the "high" and "low" designations as applied to the state of the clock signal in the description would also be interchanged. Finally, it would be possible to drive the circuit differentially by applying a first clock signal to terminal 52 and a second clock signal to terminal 50, the second clock signal being 180 degrees out of phase with the first clock signal.

In the explanation of the operation of the circuit shown in FIG. 1, let us assume that the voltage drop across resistor 18 is approximately $nV_{BE}$, that $V_1 = V_{CC} - nV_{BE}/2$, and that $V_2 = V_{CC} - (1+n/2)V_{BE}$, where n is less than 1. Also assume that the input signal appearing at terminal 54 may swing from a logical "1" ($V_{CC} - V_{BE}$) to a logical "0" ($V_{CC} - (1+n)V_{BE}$). The amount of swing between a logical "1" and a logical "0" represents a compromise. A high voltage swing will result in a greater noise margin while a low voltage swing will reduce saturation effects. A voltage swing of ($\frac{2}{3}$) $V_{BE}$ has been found to be satisfactory.

The description of operation given below ignores voltage drops caused by transistor base currents since such voltages are negligible when compared with normal logic swings. The first situation to be considered is one wherein the D input at terminal 54 is at a high level ($V_{CC} - V_{BE}$) and the clock applied at terminal 52 is low. In this case, transistor 8 turns on and transistor 10 remains in an off condition since the bias voltage $V_2$ at terminal 50 is higher than the potential at the base of transistor 10. Since the voltage at the D input is assumed to be $V_{CC} - V_{BE}$ and the bias voltage $V_1$ at the base of transistor 2 is $V_{CC} - nV_{BE}/2$, transistor 2 remains off. Thus, the current flow path is from the D input terminal 54 through transistor 8, resistor 20 and current sink 22. Current flowing through resistor 18 is negligible and therefore the voltage at the base of transistor 12 is $V_{CC}$.

When the clock signal at terminal 52 rises above bias voltage $V_2$, transistor 10 turns on and transistor 8 turns off. With $V_{CC}$ at the base of transistor 12, transistor 12 turns on producing a logical "1" state on emitter 14. Furthermore, when transistor 12 turns on, emitter 16 holds emitter 4 up thus preventing emitter 4 of transistor 2 from turning on. Thus, the signal that was at the $D_{IN}$ terminal 54 is latched at emitter 14 of transistor 12 when the clock is high.

Looking now at the slave portion of the circuit, the high logic level at emitter 14 of transistor 12 is applied to the slave portion of the flip-flop via conductor 55. Since the voltage on clock terminal 52 is higher than bias voltage $V_2$, transistor 30 is on and transistor 32 is off. Transistor 24 remains off and no current flows through resistor 40. In this manner, $V_{CC}$ is applied to the base of transistor 34 causing a high to appear at emitter 36 which represents the Q output at terminal 56. Thus, when the clock is high, the D input at terminal 54 is latched in the master portion of the circuit and fed through to the output of the slave portion.

When the clock signal again goes low, transistor 30 turns off and transistor 32 turns on. Current flows through emitter 38 of transistor 34. Transistor 24 remains off and again no current flows through resistor 40. Transistor 34 remains on and the high voltage is maintained at output terminal 56. Now that the slave portion of the circuit is latched, the master portion is again free to respond to the D input at terminal 54.

If the clock signal at terminal 52 is low transistor 8 turns on and transistor 10 turns off. Assume the terminal 54 ($D_{IN}$) is now fed a low signal from the emitter of an emitter follower (not shown). There is now sufficient potential across the base-emitter junction (emitter 6) of transistor 2 to turn it on. This also keeps the emitter-follower feeding the D input in an off state. Current flows through resistor 18 producing a voltage equivalent to $V_{CC} - nV_{BE}$ at the base of transistor 12. Transistor 12 remains off producing a low on the emitter 14 of transistor 12 which represents the output of the master portion of the circuit. When the clock again goes high, current continues to flow through transistor 2 and resistor 18 maintaining the low state on emitter 14. This low voltage from emitter 14 of transistor 12 is applied via conductor 55 to the slave portion of the circuit. Since the base of transistor 24 is coupled to $V_1$ at terminal 48 and $V_1$ is higher than the base of transistor 12, transistor 24 turns on causing current to flow through resistor 40. This reduces the voltage on the base of transistor 34 causing a low to appear at emitter 36 which is in turn coupled to the Q output terminal 56.

To convert a delay master-slave type flip-flop into a toggle flip-flop, it is only necessary to couple the $\overline{Q}$ output into the D input. As shown in FIG. 1, however, no $\overline{Q}$ output is generated. The $\overline{Q}$ output is commonly generated by splitting devices 12 and 34 into single emitter devices 57, 58, 60 and 62, adding an additional load resistor 64 between the collector of transistor 60 and $V_{CC}$, and adding output transistor 66 having a base coupled to the collectors of transistors 58 and 60, a collector coupled to $V_{CC}$ and an emitter coupled to terminal 68 at which the $\overline{Q}$ output appears.

Figure 2:
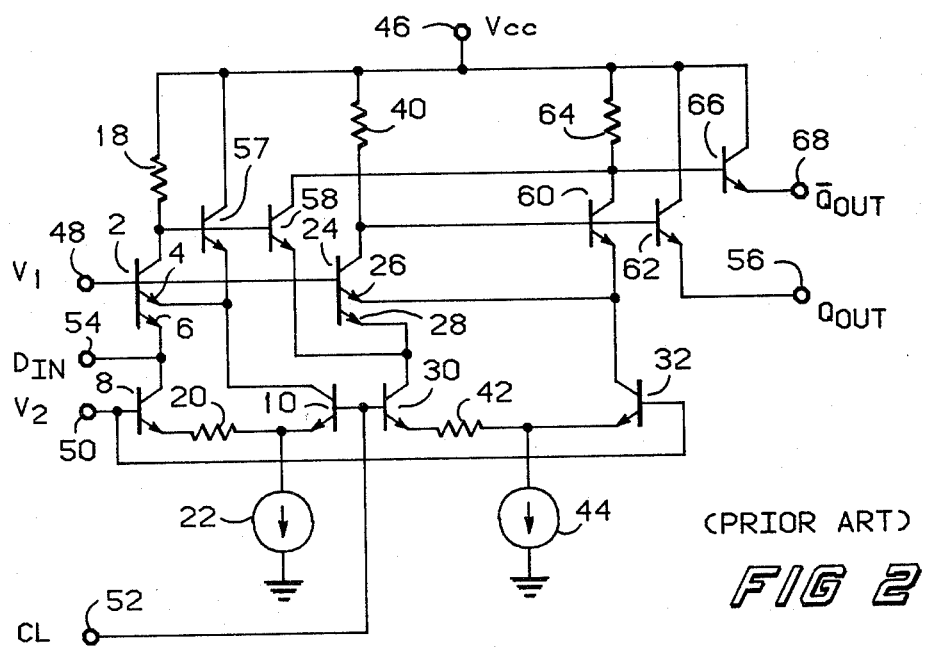
FIG. 2 is a schematic diagram of a prior art EFL modified so as to produce a $\overline{Q}$ output.

As should be apparent from FIG. 1, to produce the $\overline{Q}$ output requires that the voltage across resistor 40 be inverted since it is that voltage which controls the Q output. This inversion is provided in FIG. 2 during the low state of the clock by coupling resistor 40 to the base of transistor 60. The required inversion appears at the collector of transistor 60 which in turn is coupled to the base of output transistor 66. In order to provide the necessary current path for current through resistor 64 when the clock signal is high so as to maintain the $\overline{Q}$ signal at terminal 68 valid, the collector of transistor 58 is coupled to resistor 64 rather than to $V_{CC}$. The remainder of the circuit shown in FIG. 2 functions in the same manner as that shown in FIG. 1, and identical elements have been designated with identical reference numerals. Now to create a toggle flip-flop, it is only necessary to couple the $\overline{Q}$ output at terminal 68 to the $D_{IN}$ input at terminal 54.

The problem with this method of producing the $\overline{Q}$ output in order to produce a toggle flip-flop resides in the fact that not only is an extra load resistor 64 required, but devices 58 and 60 also require an additional isolation tub which is not required in the FIG. 1 circuit.

Figure 3:
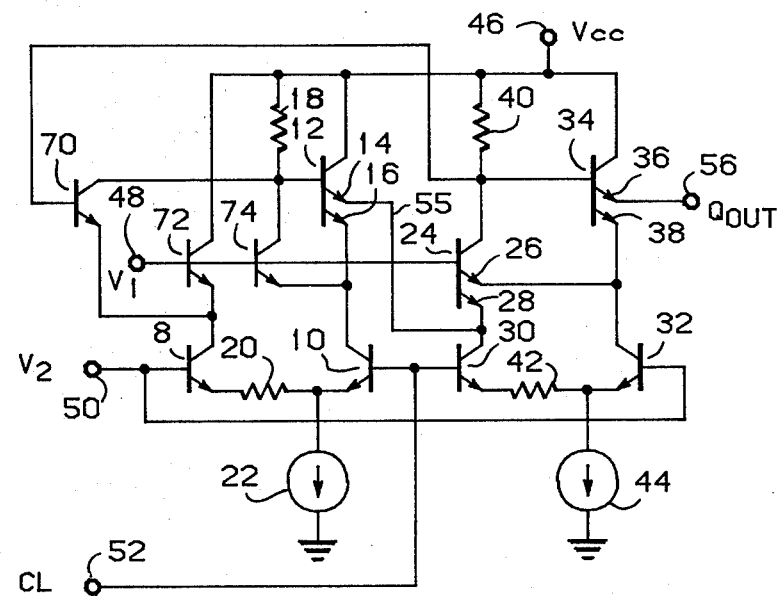
FIG. 3 is a schematic diagram of the inventive EFL toggle flip-flop.

FIG. 3 is a schematic diagram which illustrates how the prior art circuit of FIG. 1 may be modified to produce a toggle flip-flop which does not require additional load resistors nor isolation tubs. Again, like elements have been denoted with like reference numerals. Instead of splitting transistors 12 and 34 of FIG. 1, as was the case in the FIG. 2 circuit, transistor 2 of FIG. 1 is split into single emitter transistors 72 and 74. The collector of transistor 72 is coupled directly to $V_{CC}$ while the collector of transistor 74 is coupled to $V_{CC}$ through load resistor 18. The base electrodes of transistor 72 and 74 are coupled to bias voltage $V_1$ as was the case with dual emitter transistor 2 in FIG. 1.

To create the required inversion of the voltage across resistor 40, resistor 40 is coupled to the base electrode of transistor 70 which in turn has a collector coupled to resistor 18. The emitter of transistor 70 is coupled to the emitter of transistor 72 and to the collector of transistor 8. Thus, the required inversion is now produced by single transistor 70 operating in conjunction with existing load resistor 18.

When the clock is low and transistor 8 is conducting, transistor 70 will conduct if the voltage at the junction of resistor 40 and transistor 34 is $V_{CC}$ thus producing an $nV_{BE}$ drop across resistor 18. If the voltage across resistor 40 is $nV_{BE}$, transistor 72 will conduct instead of transistor 70 and no voltage will appear across resistor 18. When the clock goes high and transistor 10 conducts, the voltage across resistor 18 is latched in its previous state by current flow through transistor 74 if the voltage was $V_{CC}-nV_{BE}$, and by current through emitter 16 of transistor 12 if the voltage was $V_{CC}$.

The operation of the remainder of the circuit is the same as in FIG. 1. Not only has the toggle flip-flop been produced without the introduction of additional load resistors or isolation tubs, but there is also one less stage between the Q output and the collector of transistor 70, thus allowing higher speed operation than the FIG. 2 circuit.

As was the case in FIG. 1, additional follower transistors may be utilized to drive the bases of transistors 12, 34 and 70.

The above description is given by way of example only. Changes in form and details may be made by one skilled in the art without departing from the scope of the invention.

We claim:

1. A toggle flip-flop of the type controlled by a clock signal capable of assuming first and second states, said flip-flop comprising:
    a master circuit portion including:
        first output transistor means having a collector terminal coupled to a source of supply voltage and having first and second emitter terminals and a base terminal; and
        first means coupled to said first emitter terminal of said first output transistor means for latching said first output transistor means when said clock signal is in said first state;
    a slave circuit portion having an input coupled to said second emitter terminal of said first output transistor means for producing a Q output of said flip-flop, said slave circuit portion comprising:
        second output transistor means having a collector terminal coupled to said source of supply voltage, a first emitter terminal for producing said Q output and having a second emitter terminal and a base terminal;
        second means coupled to the base terminal of said second output transistor means for producing a driving voltage on said base terminal; and
        third means coupled to said second emitter terminal of said second output transistor means for latching said second output transistor means when said clock signal is in said second state; and
    fourth means coupled to said second means and to the base terminal of said first output transistor means for inverting said driving voltage and applying an inverted driving voltage to the base terminal of said first output transistor means.

2. A toggle flip-flop according to claim 1 wherein said fourth means comprises:
    a first transistor having a collector coupled to said source of supply voltage, an emitter coupled to said first means and a base which is coupled to a first bias voltage;
    a first load resistor coupled between the base terminal of said first output transistor means and said source of supply voltage; and
    a second transistor having an emitter coupled to the emitter of said first transistor and to said first means, a collector coupled to the base terminal of said first output transistor means and a base coupled to the base terminal of said second output transistor means.

3. A toggle flip-flop according to claim 2 wherein said second means comprises:
    a second load resistor coupled between the base terminal of said second output transistor means and said source of supply voltage; and
    first transistor means having a collector coupled to the base terminal of said second output transistor means, a base coupled to said first bias voltage, and an emitter coupled to said third means and to the second emitter terminal of said first output transistor means.

4. A toggle flip-flop according to claim 3 wherein said first means comprises:
    a third transistor having a collector coupled to the emitters of said first and second transistors, a base coupled to a second bias voltage, and having an emitter;
    a fourth transistor having an emitter coupled to the emitter of said third transistor, a base coupled to said clock signal, and a collector coupled to the first emitter terminal of said first output transistor means;
    a first current sink coupled to the emitters of said third and fourth transistors; and a fifth transistor having an emitter coupled to the collector of said fourth transistor, a collector coupled to the base terminal of said first output transistor means, and a base coupled to said first bias voltage.

5. A toggle flip-flop according to claim 4 wherein said third means comprises:
a sixth transistor having a base coupled to said clock signal, a collector coupled to the emitter of said first transistors means and to the second emitter terminal of said first output transistor means, and having an emitter;
seventh transistor having a base coupled to said second bias voltage, a collector coupled to the second emitter terminal of said second output transistor means, and an emitter coupled to the emitter of said sixth transistor;
a second current sink coupled to the emitters of said sixth and seventh transistors; and
second transistor means having a base coupled to said first bias voltage, a collector coupled to the base terminal of said second output transistor means and an emitter coupled to the collector of said seventh transistor.

6. A toggle flip-flop according to claim 5 wherein said first means includes a first offset resistor coupled between the emitter of said third transistor and said first current sink.

7. A toggle flip-flop according to claim 6 wherein said third means includes a second offset resistor coupled between the emitter of said sixth transistor and said second current sink.

8. A toggle flip-flop according to claim 5 wherein said first and second transistor means comprises a dual emitter transistor having a base coupled to said first bias voltage, a collector coupled to the base terminal of said second output transistor means, a first emitter coupled to the second emitter terminal of said first output transistor means, and a second emitter coupled to the collector of said seventh transistor.

* * * * *